US009136173B2

United States Patent
Grivna

(10) Patent No.: US 9,136,173 B2
(45) Date of Patent: Sep. 15, 2015

(54) SINGULATION METHOD FOR SEMICONDUCTOR DIE HAVING A LAYER OF MATERIAL ALONG ONE MAJOR SURFACE

(71) Applicant: Semiconductor Components Industries, LLC, Phoenix, AZ (US)

(72) Inventor: Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 14/057,756

(22) Filed: Oct. 18, 2013

(65) Prior Publication Data

US 2014/0127880 A1 May 8, 2014

Related U.S. Application Data

(60) Provisional application No. 61/723,548, filed on Nov. 7, 2012, provisional application No. 61/750,520, filed on Jan. 9, 2013, provisional application No. 61/774,081, filed on Mar. 7, 2013.

(51) Int. Cl.
*H01L 21/30* (2006.01)
*H01L 21/78* (2006.01)

(52) U.S. Cl.
CPC . *H01L 21/78* (2013.01); *Y10T 29/41* (2015.01)

(58) Field of Classification Search
CPC .................................................. H01L 21/78
USPC ................. 438/458, 464, 114; 257/E21.599
See application file for complete search history.

(56) References Cited

U.S. PATENT DOCUMENTS

| 4,820,377 | A | 4/1989 | Davis et al. |
| 5,075,253 | A | 12/1991 | Sliwa, Jr. |
| 5,166,097 | A | 11/1992 | Tanielian |
| 5,510,655 | A | 4/1996 | Tanielian |
| 5,753,418 | A | 5/1998 | Tsai et al. |
| 5,856,705 | A | 1/1999 | Ting |
| 5,863,813 | A | 1/1999 | Dando |
| 6,030,885 | A | 2/2000 | Bothra |
| 6,140,151 | A | 10/2000 | Akram |
| 6,165,814 | A | 12/2000 | Wark et al. |
| 6,200,851 | B1 | 3/2001 | Arnold |
| 6,214,703 | B1 | 4/2001 | Chen et al. |
| 6,342,724 | B1 | 1/2002 | Wark et al. |
| 6,406,979 | B2 | 6/2002 | Fischer et al. |
| 6,563,204 | B1 | 5/2003 | Glenn |

(Continued)

FOREIGN PATENT DOCUMENTS

| WO | WO 01/56063 A2 | 8/2001 |
| WO | WO 01/56063 A3 | 8/2001 |

(Continued)

*Primary Examiner* — Caleb Henry
(74) *Attorney, Agent, or Firm* — Kevin B. Jackson

(57) ABSTRACT

In one embodiment, die are singulated from a wafer having a back layer by placing the wafer onto a first carrier substrate with the back layer adjacent the carrier substrate, forming singulation lines through the wafer to expose the back layer within the singulation lines, and using a mechanical device to apply localized pressure to the wafer to separate the back layer in the singulation lines. The localized pressure can be applied through the first carrier substrate proximate to the back layer, or can be applied through a second carrier substrate attached to a front side of the wafer opposite to the back layer.

31 Claims, 14 Drawing Sheets

(56) References Cited

U.S. PATENT DOCUMENTS

| | | |
|---|---|---|
| 6,642,127 B2 | 11/2003 | Kumar et al. |
| 6,686,225 B2 | 2/2004 | Wachtler |
| 6,897,128 B2 | 5/2005 | Arita |
| 6,969,669 B2 | 11/2005 | Arita |
| 7,060,531 B2 | 6/2006 | Arita |
| 7,098,077 B2 | 8/2006 | Huang et al. |
| 7,129,114 B2 | 10/2006 | Akram |
| 7,253,477 B2 | 8/2007 | Loechelt et al. |
| 7,309,623 B2 | 12/2007 | Tan et al. |
| 7,335,576 B2 | 2/2008 | David et al. |
| 7,488,668 B2 | 2/2009 | Arita et al. |
| 7,629,228 B2 | 12/2009 | Haji et al. |
| 7,651,925 B2 | 1/2010 | Wyant |
| 7,678,670 B2 | 3/2010 | Arita et al. |
| 7,705,420 B2 | 4/2010 | Joodaki |
| 7,767,551 B2 | 8/2010 | Arita et al. |
| 7,781,310 B2 | 8/2010 | Grivna |
| 7,846,848 B2 | 12/2010 | Lewington et al. |
| 7,883,343 B1 | 2/2011 | Mulligan et al. |
| 7,906,410 B2 | 3/2011 | Arita et al. |
| 7,915,140 B2* | 3/2011 | Genda et al. ............. 438/462 |
| 7,985,661 B2 | 7/2011 | Grivna |
| 7,989,319 B2 | 8/2011 | Grivna et al. |
| 8,012,857 B2 | 9/2011 | Grivna et al. |
| 8,178,372 B2 | 5/2012 | Lutgen et al. |
| 8,384,231 B2 | 2/2013 | Grivna et al. |
| 8,587,130 B2* | 11/2013 | Hamasaki et al. ............. 257/777 |
| 8,691,666 B2* | 4/2014 | Segawa et al. ............. 438/464 |
| 2001/0000079 A1* | 3/2001 | Usami et al. ............. 438/119 |
| 2003/0207579 A1 | 11/2003 | Rattner et al. |
| 2003/0235937 A1* | 12/2003 | Mong et al. ............. 438/106 |
| 2004/0087065 A1 | 5/2004 | Udrea et al. |
| 2004/0102025 A1 | 5/2004 | Arita |
| 2004/0185580 A1 | 9/2004 | Goh |
| 2005/0084996 A1 | 4/2005 | Harper |
| 2005/0104165 A1 | 5/2005 | Ishio et al. |
| 2005/0142863 A1 | 6/2005 | Spandre |
| 2005/0196940 A1* | 9/2005 | Yajima et al. ............. 438/460 |
| 2006/0001130 A1 | 1/2006 | Islam et al. |
| 2006/0030078 A1 | 2/2006 | Jiang et al. |
| 2006/0115962 A1* | 6/2006 | Maeda ............. 438/460 |
| 2006/0118515 A1 | 6/2006 | Dolechek et al. |
| 2006/0141677 A1* | 6/2006 | Munakata et al. ............. 438/127 |
| 2006/0154401 A1 | 7/2006 | Gardner et al. |
| 2006/0166466 A1* | 7/2006 | Maki et al. ............. 438/464 |
| 2006/0244096 A1 | 11/2006 | Sekiya |
| 2006/0278956 A1 | 12/2006 | Cadouri |
| 2007/0087524 A1 | 4/2007 | Montgomery |
| 2007/0132034 A1 | 6/2007 | Curello et al. |
| 2007/0148807 A1 | 6/2007 | Akram |
| 2007/0249178 A1 | 10/2007 | Ogihara |
| 2008/0099900 A1 | 5/2008 | Oganesian et al. |
| 2008/0190902 A1* | 8/2008 | Nakamura ............. 219/121.67 |
| 2009/0001609 A1 | 1/2009 | Lim |
| 2009/0057838 A1 | 3/2009 | Arita et al. |
| 2009/0061595 A1 | 3/2009 | Weber et al. |
| 2009/0065904 A1 | 3/2009 | Wang |
| 2009/0075459 A1* | 3/2009 | Sato et al. ............. 438/464 |
| 2009/0263927 A1 | 10/2009 | Lin et al. |
| 2010/0029059 A1* | 2/2010 | Matsumura et al. ............. 438/464 |
| 2010/0029061 A1* | 2/2010 | Kamiya et al. ............. 438/464 |
| 2010/0048001 A1 | 2/2010 | Harikai et al. |
| 2010/0055875 A1 | 3/2010 | Haji et al. |
| 2010/0129985 A1* | 5/2010 | Ootake et al. ............. 438/464 |
| 2010/0129986 A1* | 5/2010 | Kamiya et al. ............. 438/464 |
| 2010/0129988 A1* | 5/2010 | Ootake et al. ............. 438/464 |
| 2010/0129989 A1* | 5/2010 | Kamiya et al. ............. 438/464 |
| 2010/0173474 A1 | 7/2010 | Arita et al. |
| 2010/0227454 A1* | 9/2010 | Dohmae ............. 438/464 |
| 2010/0240196 A1* | 9/2010 | Saito et al. ............. 438/464 |
| 2010/0248451 A1* | 9/2010 | Pirogovsky et al. ............. 438/463 |
| 2010/0261336 A1* | 10/2010 | Morita ............. 438/462 |
| 2010/0279491 A1* | 11/2010 | Kiuchi et al. ............. 438/464 |
| 2010/0311226 A1* | 12/2010 | Hamasaki et al. ............. 438/464 |
| 2010/0311227 A1* | 12/2010 | Hatakeyama et al. ............. 438/464 |
| 2010/0314781 A1* | 12/2010 | Hayashi et al. ............. 257/778 |
| 2011/0053346 A1* | 3/2011 | Matsumura et al. ............. 438/458 |
| 2011/0175209 A1 | 7/2011 | Seddon et al. |
| 2011/0175225 A1 | 7/2011 | Seddon et al. |
| 2011/0177675 A1 | 7/2011 | Grivna et al. |
| 2011/0189835 A1* | 8/2011 | Sugo et al. ............. 438/464 |
| 2011/0237050 A1* | 9/2011 | Sugimura et al. ............. 438/465 |
| 2011/0244657 A1* | 10/2011 | Grivna et al. ............. 438/462 |
| 2011/0294279 A1* | 12/2011 | Okamura ............. 438/460 |
| 2011/0318879 A1* | 12/2011 | Hatakeyama et al. ............. 438/114 |
| 2012/0028415 A1* | 2/2012 | Shiga et al. ............. 438/113 |
| 2012/0061805 A1* | 3/2012 | Amano et al. ............. 257/622 |
| 2012/0068312 A1* | 3/2012 | Tanaka et al. ............. 257/620 |
| 2012/0070960 A1* | 3/2012 | Murata et al. ............. 438/464 |
| 2012/0238073 A1* | 9/2012 | Johnson et al. ............. 438/464 |
| 2012/0244681 A1 | 9/2012 | Grivna et al. |
| 2012/0309170 A1* | 12/2012 | Hayashishita et al. ............. 438/464 |
| 2012/0329250 A1* | 12/2012 | Oda et al. ............. 438/465 |
| 2013/0095639 A1* | 4/2013 | Takamoto et al. ............. 438/464 |
| 2013/0122688 A1* | 5/2013 | Sasaki et al. ............. 438/463 |
| 2013/0157415 A1* | 6/2013 | Morita et al. ............. 438/113 |
| 2013/0178006 A1* | 7/2013 | Kim et al. ............. 438/33 |
| 2013/0230973 A1* | 9/2013 | Gauldin et al. ............. 438/464 |
| 2013/0330910 A1* | 12/2013 | Tanaka et al. ............. 438/462 |
| 2014/0057411 A1* | 2/2014 | Hoang et al. ............. 438/460 |
| 2014/0127880 A1* | 5/2014 | Grivna ............. 438/458 |
| 2014/0159254 A1* | 6/2014 | Takamoto et al. ............. 257/778 |

FOREIGN PATENT DOCUMENTS

| | | |
|---|---|---|
| WO | 2004066382 A1 | 8/2004 |
| WO | 2007007883 A1 | 1/2007 |
| WO | PCT/JP2007/066960 | 8/2007 |
| WO | 2008081968 A1 | 7/2008 |
| WO | 2009063620 A1 | 5/2009 |

* cited by examiner

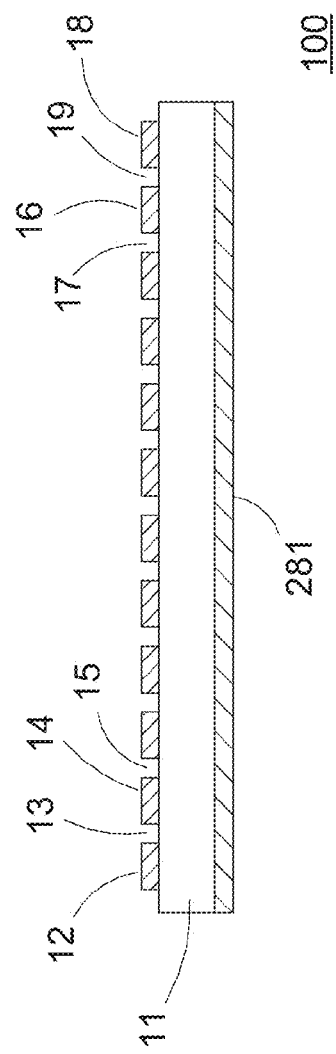
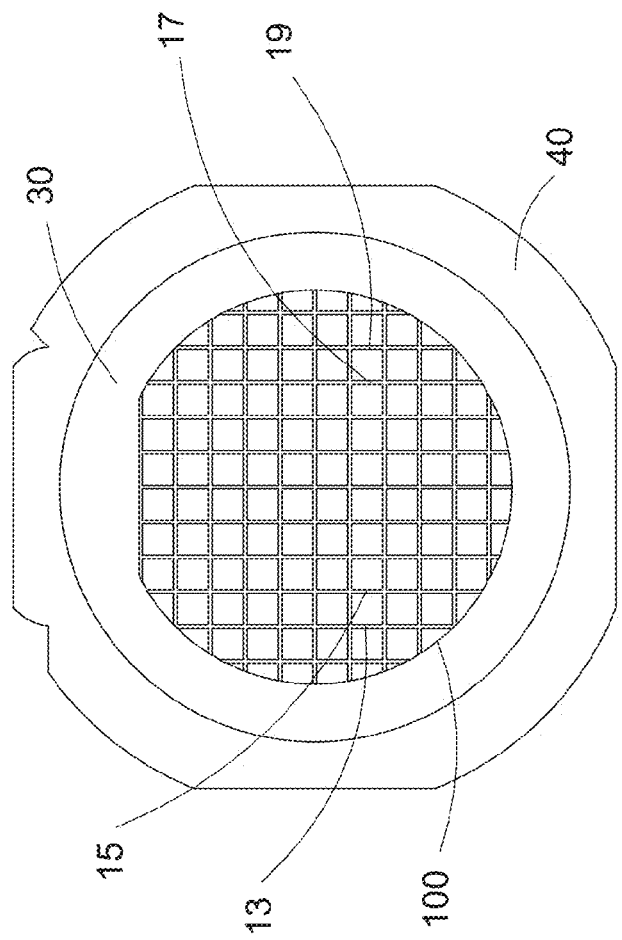
FIG. 8
FIG. 9

SINGULATION METHOD FOR SEMICONDUCTOR DIE HAVING A LAYER OF MATERIAL ALONG ONE MAJOR SURFACE

CROSS REFERENCE TO RELATED APPLICATION

This application claims the benefit of priority from U.S. Provisional Application No. 61/723,548, which was filed on Nov. 7, 2012, and fully incorporated herein. This application also claims the benefit of priority from U.S. Provisional Application No. 61/750,520, which was filed on Jan. 9, 2013, and fully incorporated herein. This application further claims the benefit of priority from U.S. Provisional Application No. 61/774,081, which was filed on Mar. 7, 2013, and fully incorporated herein.

BACKGROUND

The present invention relates, in general, to electronics and, more particularly, to methods and apparatus for forming semiconductors.

In the past, the semiconductor industry utilized various methods and equipment to singulate individual semiconductor die from a semiconductor wafer on which the die was manufactured. Typically, a technique called scribing or dicing was used to either partially or fully cut through the wafer with a diamond cutting wheel along scribe grids or singulation lines that were formed on the wafer between the individual die. To allow for the alignment and the width of the dicing wheel each scribe grid usually had a large width, generally about one hundred fifty (150) microns, which consumed a large portion of the semiconductor wafer. Additionally, the time required to scribe each singulation line on the semiconductor wafer could take over one hour or more. This time reduced the throughput and manufacturing capacity of a production facility.

Other methods, which have included thermal laser separation (TLS), laser ablation dicing, and plasma dicing, have been explored as alternatives to scribing. Plasma dicing is a promising process compared to scribing and other alternative processes because it supports narrower scribe lines, has increased throughput, and can singulate die in varied and flexible patterns. However, plasma dicing has had manufacturing implementation challenges. Such challenges have included non-compatibility with wafer backside layers, such as back metal layers, because the etch process has been unable to effectively remove or separate the backside layers from the singulation lines. Removing or separating the backside layers from the scribe lines is necessary to facilitate subsequent processing, such as pick-and-place and assembly processes.

Accordingly, it is desirable to have a method of singulating die from a semiconductor wafer that removes or separates the backside layers from within the singulation lines. It would be beneficial for the method to be cost effective and to minimize any damage to or contamination of the separated die.

BRIEF DESCRIPTION OF THE DRAWINGS

FIG. 8 illustrates a cross-sectional view of a wafer in accordance with a second embodiment of the present invention;

FIG. 9 illustrates a top view of the second embodiment after subsequent processing in accordance with the present invention;

For simplicity and clarity of the illustration, elements in the figures are not necessarily drawn to scale, and the same reference numbers in different figures denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

Figure 1:
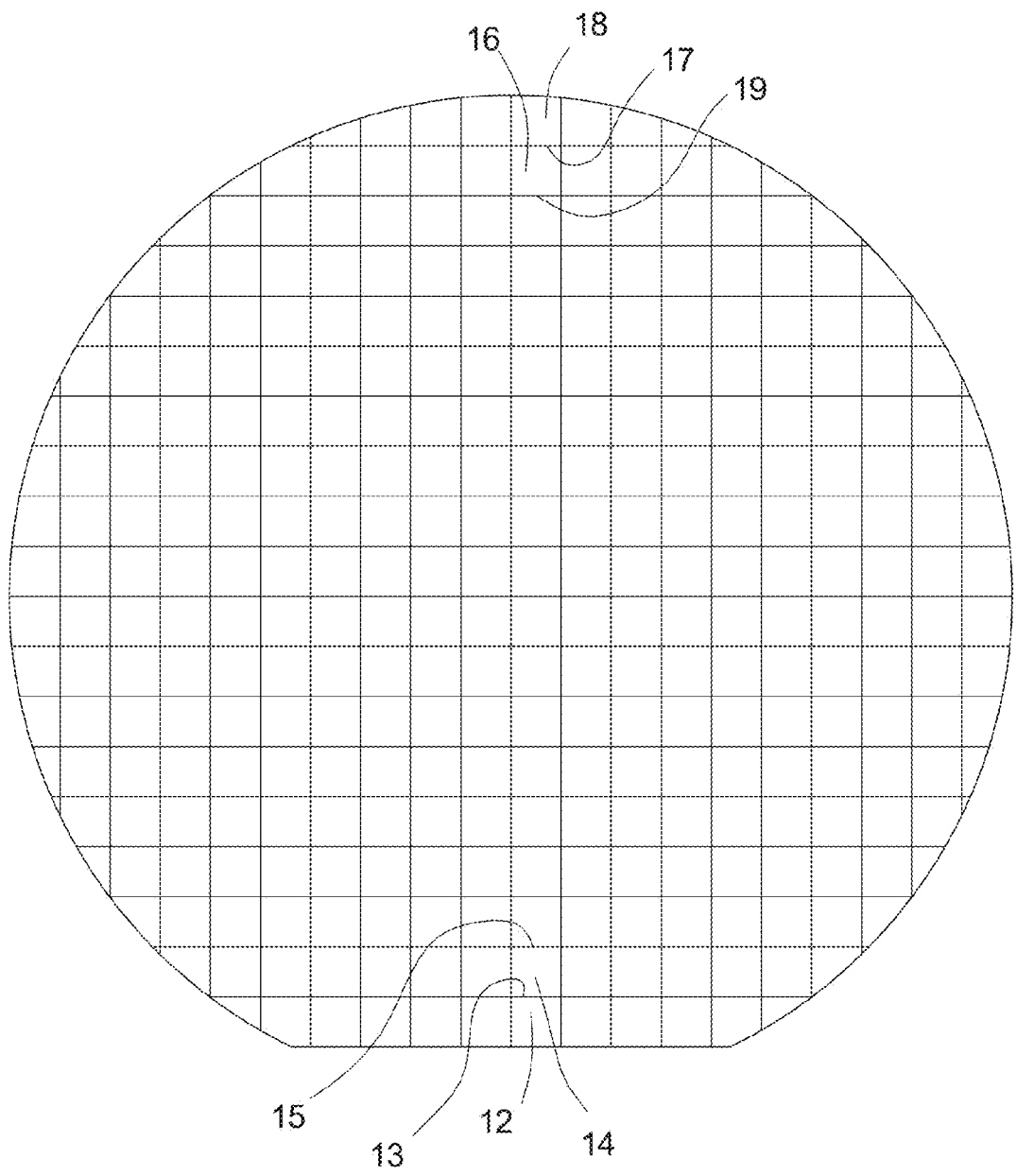
FIG. 1 illustrates a reduced plan view of an embodiment of a wafer in accordance with the present invention.

FIG. 1 is a reduced plan view that graphically illustrates a wafer 10 at a later step in fabrication. In one embodiment, wafer 10 can be a semiconductor substrate. Wafer 10 includes a plurality of semiconductor die, such as die 12, 14, 16, and 18, that are formed on or as part of semiconductor wafer 10. Die 12, 14, 16, and 18 are spaced apart from each other on wafer 10 by spaces in which singulation lines are to be formed or defined, such as scribe lines or singulation lines 13, 15, 17, and 19. As is well known in the art, all of the semiconductor die on wafer 10 generally are separated from each other on all sides by areas where scribe lines or singulation lines, such as singulation lines 13, 15, 17, and 19 are to be formed. Die 12, 14, 16, and 18 can be any kind of electronic device including semiconductor devices such as, diodes, transistors, discrete devices, sensor devices, optical devices, integrated circuits or other devices known to one of ordinary skill in the art. In one embodiment, wafer 10 has completed wafer processing including the formation of a backside layer described hereinafter.

Figure 2:
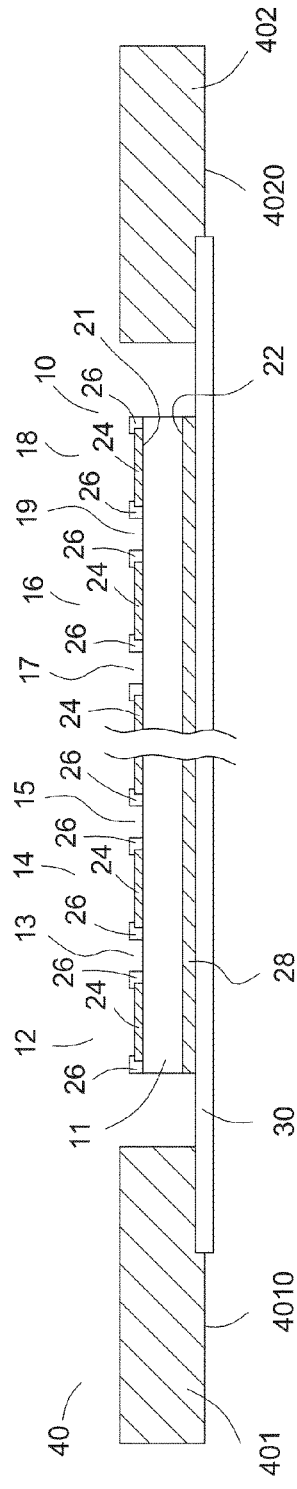
FIGS. 2-5 illustrate partial cross-sectional views of an embodiment of a the wafer of FIG. 1 at various stages in a process of singulating die from the wafer in accordance with an embodiment of the present invention.

FIG. 2 illustrates an enlarged cross-sectional view of wafer 10 at an early step in a die singulation method in accordance with a first embodiment. In one embodiment, wafer 10 is attached to a carrier substrate, transfer tape, or carrier tape 30 that facilitates supporting the plurality of die after they are singulated. Such carrier tapes are well known to those of skill in the art. In one embodiment, carrier tape 30 can be attached to a frame 40, which can include frame portions or portions 401 and 402. As illustrated, carrier tape 30 can be attached to surface 4010 of frame portion 401 and to surface 4020 of frame portion 402.

In the cross-section illustrated, wafer 10 can include a bulk substrate 11, such as a silicon substrate, which can include opposing major surfaces 21 and 22. In other embodiments, bulk substrate 11 can comprise other semiconductor materials such as heterojunction semiconductor materials. In one embodiment, contact pads 24 can be formed along, in, on, or above portions of major surface 21 to provide for electrical contact between structures formed within substrate 11 and next levels of assembly or external elements. For example, contact pads 24 can be formed to receive bonding wires or clips that may be subsequently be attached to contact pads 24, or contact pads 24 can be formed to receive a solder ball, bump or other type of attachment structure. Contact pads 24 generally can be a metal or other conductive material. Typically, a dielectric material 26 such as, a blanket deposited dielectric layer can be formed on or overlying major surface 21 to function as a passivation layer for wafer 10. In one embodiment, dielectric material 26 can be a material that etches at a slower rate than that of substrate 11. In one embodiment, dielectric material 26 can be a silicon oxide, silicon nitride, or polyimide when substrate 11 is silicon.

In one embodiment, openings can be formed in dielectric material 26 (and other dielectric layers that can be formed underneath dielectric material 26) to expose underlying surfaces of contact pads 24 and surfaces of substrate 11 where singulation lines 13, 15, 17, and 19 are to be formed. In one embodiment, a patterned photoresist layer can be used for the openings using an etching process. As illustrated in FIG. 2 and in accordance with the present embodiment, wafer 10 further includes a layer of material 28 formed on or overlying major surface 22 of wafer 10. In one embodiment, layer 28 can be a conductive back metal layer. In one embodiment, layer 28 can be a multi-layer metal system such as, titanium/nickel/silver, titanium/nickel/silver/tungsten, chrome/nickel/gold, copper, copper alloys, gold, or other materials known to those skilled in the art. In another embodiment, layer 28 can be a wafer backside coating (WBC) film, such as a die-attach coating or film. In one embodiment, layer 28 can be formed having or provided with gaps, spaces, or channels between at least some adjacent die. In a further embodiment, the gaps are substantially aligned with corresponding spaces on the opposite side of wafer 10 where singulation lines 13, 15, 17, 19 will be formed. In another embodiment, layer 28 is separated from edges of least some of the die.

Figure 3:
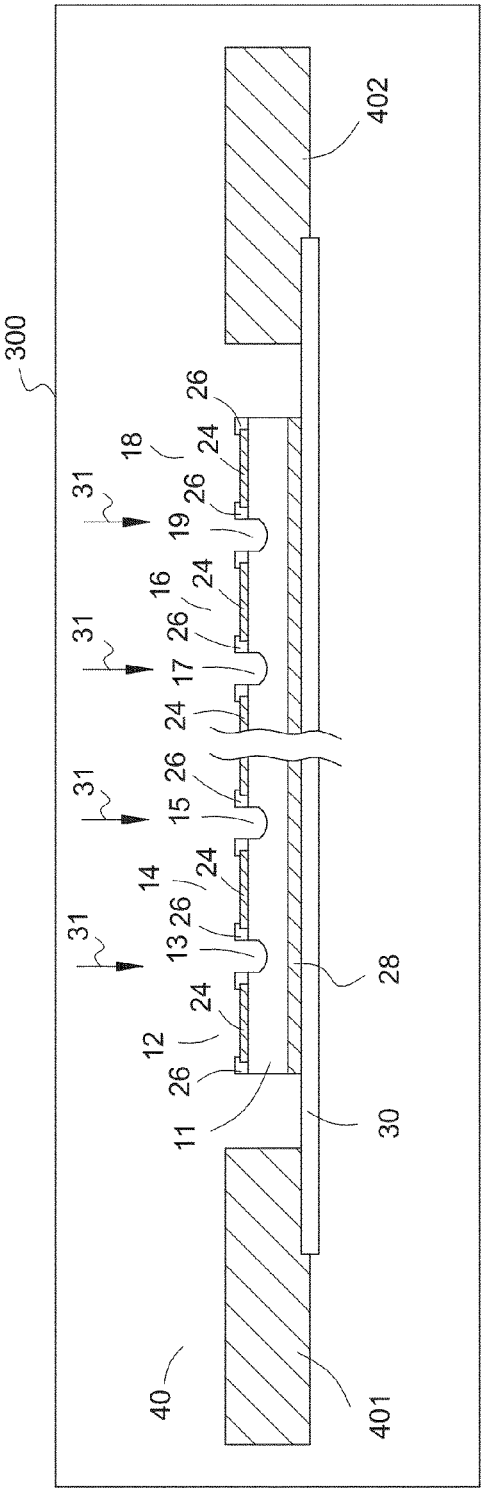
Figure 4:
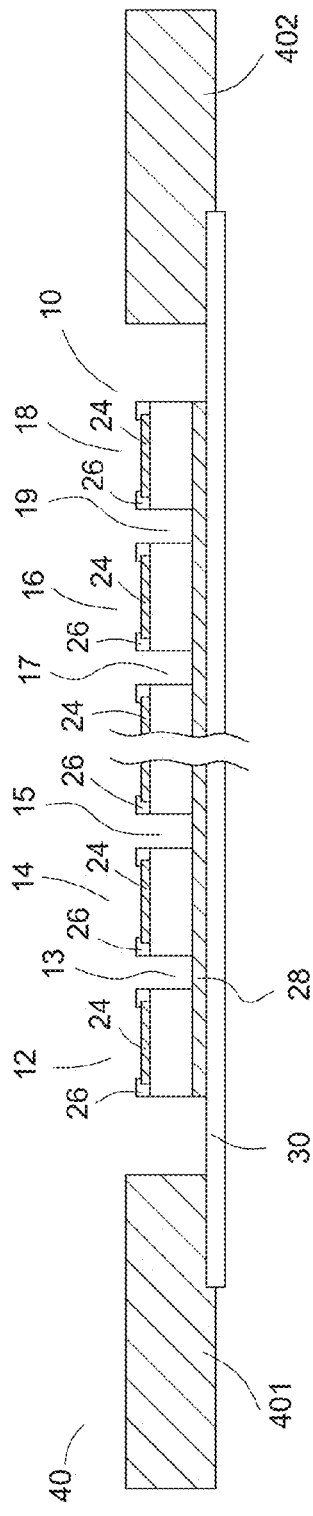

FIG. 3 illustrates an enlarged cross-sectional view of wafer 10 at a subsequent step during a singulation process. In FIG. 3, a plasma or dry etch singulation process is illustrated. It is understood that other singulation processes can be used. In one embodiment, wafer 10 can be mounted on carrier tape or film 30 and then can be placed within an etch apparatus 300, such as a plasma etch apparatus. In one embodiment, substrate 11 can be etched through the openings to form or define singulation lines or openings 13, 15, 17, and 19 extending from major surface 21. The etching process can be performed using a chemistry (generally represented as arrows 31) that selectively etches silicon at a much higher rate than that of dielectrics and/or metals. In one embodiment, wafer 10 can be etched using a process commonly referred to as the Bosch process. In one embodiment, wafer 10 can be etched using the Bosch process in a deep reactive ion etch system. In one embodiment, the width of singulation lines 13, 15, 17, and 19 can be from about five microns to about twenty microns. Such a width is sufficient to ensure that the openings that form singulation lines 13, 15, 17, and 19 can be formed completely through substrate 11 stopping proximate to or on layer 28 because of the etch selectivity as generally illustrated in FIG. 4. In one embodiment, layer 28 can be used as a stop layer for the plasma etch singulation process. In one embodiment, singulation lines 13, 15, 17, and 19 can be formed in about five to about thirty minutes using the Bosch process.

Figure 5:
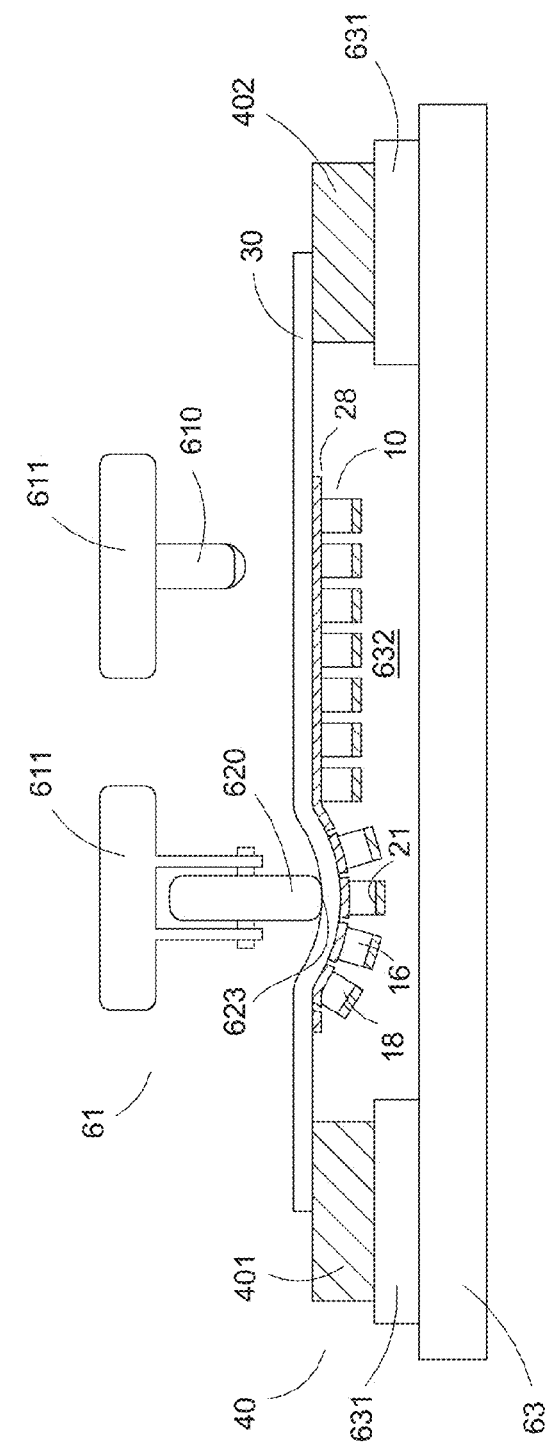

FIG. 5 illustrates a cross-sectional view of wafer 10 at a subsequent process step. In one embodiment, frame 40 can be placed onto a holding device 63 or support structure 63. In one embodiment, support structure 63 can include pedestal(s) or standoff(s) 631 that is configured to provide a gap 632, depression 632, or well 632 or another structure that allows wafer 10 and tape 30 to expand without contacting support structure 63 during subsequent processing. In one embodiment, frame 40 can be reversibly attached to support structure 63 using vacuum or a clamping structure.

In one embodiment, layer 28 is separated by a mechanical device 61, such as a stylus 610 or a rotating wheel 620 as illustrated in FIG. 5. In one embodiment, surface 21 is free floating (i.e., well 632 is an air gap) as illustrated in FIG. 5. In another embodiment, surface 21 can be in contact with a flexible support structure such as polyimide or any number of flexible polymers. In one embodiment, mechanical device 61 is configured to provide a reduced area or localized pressure point 623 onto wafer 10. In one embodiment, mechanical device 61 can be configured to have a radius that is approximately half the width of die 12, 14, 16, and 19. In another embodiment, mechanical device 61 can be configured to have a radius that is approximately equal to a width of die 12, 14, 16, and 19. In one embodiment, the radius of mechanical device 61 can be selected to be approximately double the size of die 12, 14, 16, and 19 or greater. Mechanical device 61 can be configured with pressure, speed, and alignment control. Also, mechanical device 61 can be configured with a quick disconnect device 611 to allow for simplified removal of mechanical device 61 from a main apparatus, which improves process flexibility. Mechanical device 61 can be made of a metal, rubber, organic solid material (for example, a plastic), ceramic, composite material, combinations thereof, or other materials known to those of ordinary skill in the art. In the embodiment illustrated, rotating wheel 620 can be passed along tape 30 with sufficient pressure applied to separate layer 28 while minimizing any detrimental effects to die 12, 14, 16, and 19. In one embodiment, more than one mechanical device 61 can be used to separate layer 28.

Figure 6:
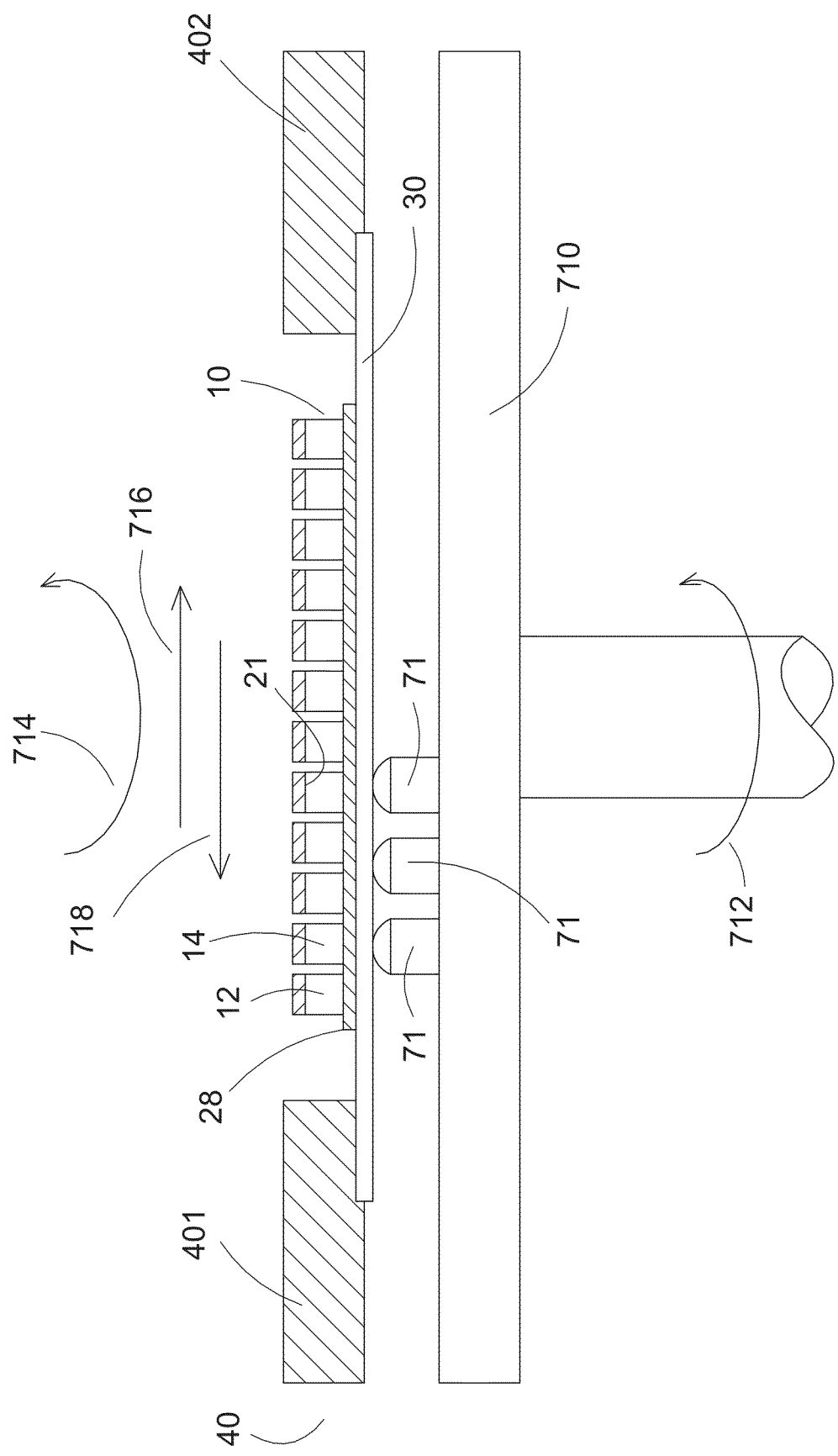
FIG. 6 illustrates a cross-sectional view of the wafer of FIG. 1 at a stage of processing within an apparatus in accordance with another embodiment of the present invention.

FIG. 6 illustrates a cross-sectional view of wafer 10 at subsequent process step as an alternative embodiment to FIG.

Figure 7:
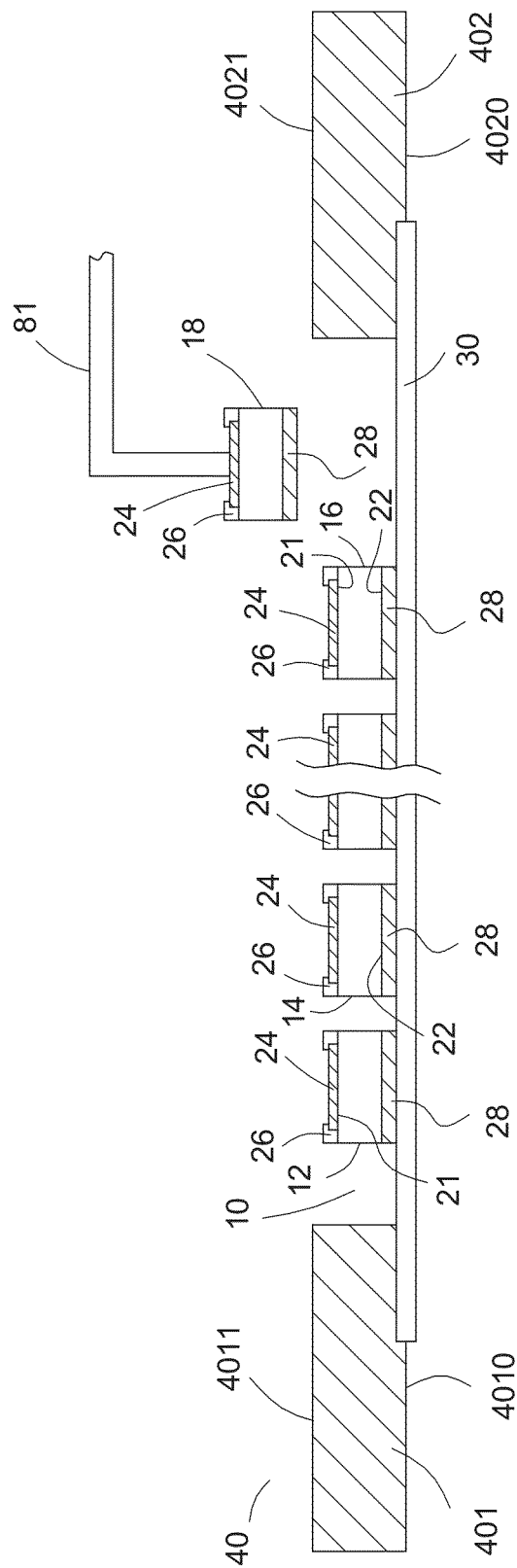
FIG. 7 illustrates a partial cross-sectional view of an embodiment of the wafer of FIG. 5 or FIG. 6 at a later stage of processing in accordance with an embodiment of the present invention.

5. In one embodiment, multiple mechanical devices 71 can be formed on a plate structure 710. Mechanical devices 71 can be similar to mechanical devices 61. In one embodiment, mechanical devices 71 can be styluses configured to provide localized pressure points onto wafer 10. In one embodiment, plate structure 710 can be placed against tape 30 with sufficient pressure applied to separate layer 28. In one embodiment, plate structure 710 can rotate as illustrated by arrow 712. In another embodiment, frame 40 can be rotated over plate structure 710 as illustrated by arrow 714 or moved horizontally back-and-forth over plate structure 710 as illustrated by arrows 716 and 718 to separate layer 28. In a subsequent step, die 12, 14, 16, and 18 can be removed from carrier tape 30 as part of a further assembly process using, for example, a pick-and-place apparatus 81 as generally illustrated in FIG. 7. In one embodiment, carrier tape 30 can be exposed to a UV light source prior to the pick-and-place step to reduce the adhesiveness of the tape.

FIG. 8 illustrates a partial cross-sectional view of a wafer 100 in accordance with a second embodiment. In one embodiment, substrate 100 can be a semiconductor wafer similar to semiconductor wafer 10, and can have a plurality of die or semiconductor die 12, 14, 16, and 18. Die 12, 14, 16, and 18 are spaced apart from each other on substrate 100 by spaces in which singulation lines are to be formed or defined, such as scribe lines or singulation lines 13, 15, 17, and 19. Die 12, 14, 16, and 18 can be any kind of electronic device including semiconductor devices such as, diodes, transistors, discrete devices, sensor devices, optical devices, integrated circuits or other devices known to one of ordinary skill in the art.

In one embodiment, wafer 100 has completed wafer processing including the formation of a backside layer 281. In one embodiment, backside layer 281 is a continuous film. The method in accordance with the present embodiment is configured for processing wafers having thicker layers or materials on the backside of wafer 100. It was found in some wafers with thicker backside materials that the cracks that form during the separation process can undesirably propagate or wander into the active areas of the die, which can lead to device failures. In one embodiment, layer 281 can be a wafer backside coating or WBC formed using, for example stencil, screen printing, and/or spin coating techniques. By way of example, the WBC can be a die attach adhesive material having a thickness from about 5 microns to about 50 microns. In one embodiment, the WBC can be a die attach adhesive material having a thickness of about 20 microns. Layer 281 can be configured to facilitate the attachment of die 12, 14, 16, and 18 to a next level of assembly, such as a leadframe or a printed circuit board. In another embodiment, layer 281 can be a back metal layer having a thickness greater than about 2 microns or 3 microns. In one embodiment, layer 281 can be a titanium/nickel/gold/tin (Ti/Ni/Au/Sn) back metal structure having a thickness greater than about 3 microns. As those skilled in the art appreciate, whether the present embodiment is used can depend on not only thickness of the materials present, but also the kinds materials present. In one embodiment, layer 281 can be formed having or provided with gaps, spaces, or channels between at least some adjacent die. In a further embodiment, the gaps are substantially aligned with corresponding spaces on the opposite side of wafer 10 where singulation lines 13, 15, 17, 19 will be formed. In another embodiment, layer 281 is separated from edges of least some of the die.

Figure 10:
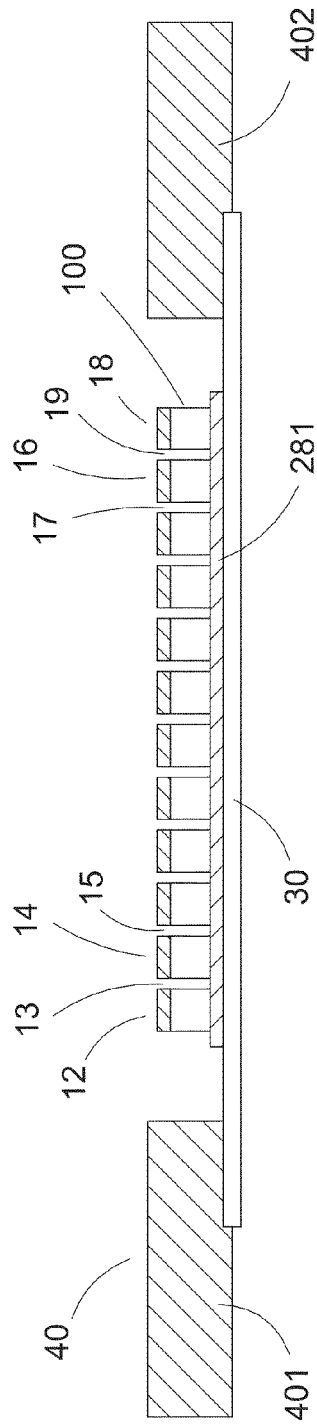
FIG. 10 illustrates a cross-sectional view of the second embodiment after subsequent processing in accordance with the present invention.

FIG. 9 illustrates a top view of wafer 100 after subsequent processing in which singulation lines or openings 13, 15, 17, and 19 are formed. In one embodiment, wafer 100 can be mounted on carrier tape 30 with layer 281 against carrier tape 30. In one embodiment, carrier tape 30 is mounted to frame 40. Wafer 100 can then be placed into the etch apparatus as described in FIG. 3 to form or define singulation lines 13, 15, 17, and 19. FIG. 10 illustrates a cross-sectional view of wafer 100 after singulation lines 13, 15, 17 and 19 are defined. In one embodiment, singulation lines 13, 15, 17 and 19 end or terminate adjacent or proximate to or stop on layer 281.

Figure 11:
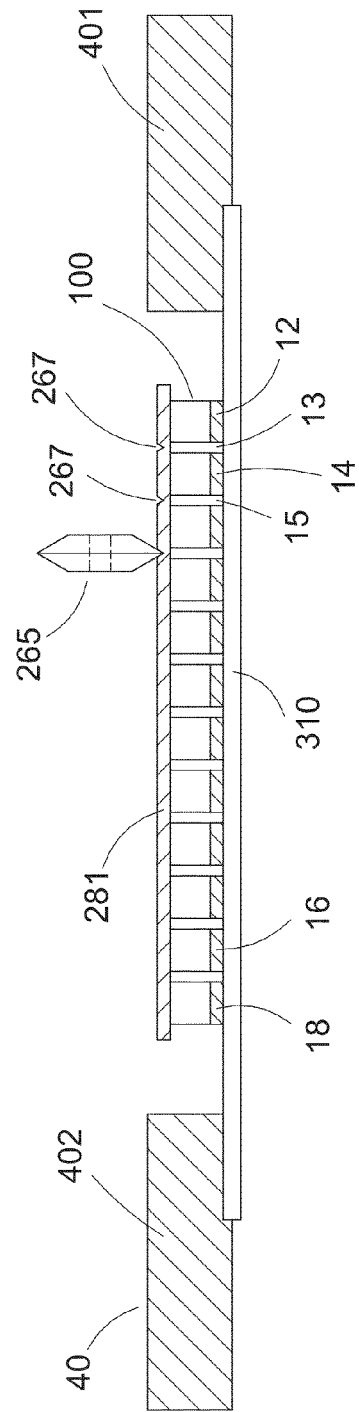
FIG. 11 illustrates a cross-sectional view of the second embodiment after additional processing in accordance with the present invention.

FIG. 11 illustrates a cross-sectional view of wafer 100 after additional processing. In one embodiment, a carrier film or substrate 310 is placed overlying the front surface or the surface opposite to layer 281. In one embodiment, carrier film 310 can be a carrier tape with characteristics similar to carrier tape 30, a carrier tape with lighter adhesive compared to carrier tape 30, a protective film, or other materials as known to those of ordinary skill in the art. In one embodiment, carrier film 310 overlaps onto carrier 40 as illustrated in FIG. 11. Carrier tape 30 can be removed to expose layer 281. In an optional step, a mechanical tool 365, such as a scribe can be used to form scribe lines 267, which are generally aligned with singulation lines 13, 15, 17, and 19.

Figure 12:
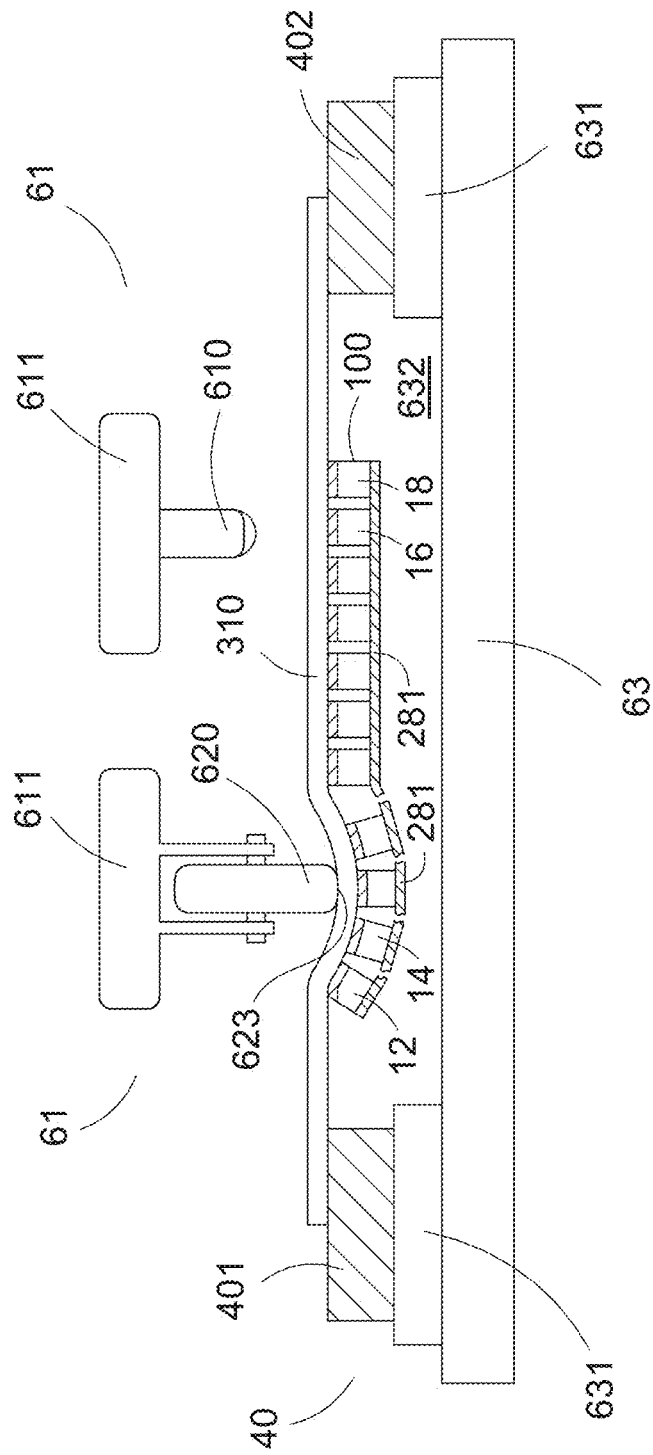
FIG. 12 illustrates a cross-sectional view of the second embodiment after further processing in accordance with the present invention.

FIG. 12 illustrates a cross-sectional view of wafer 100 at a subsequent process step. In one embodiment, frame 40 can be placed onto a holding device 63 or support structure 63. In one embodiment, support structure 63 can include pedestal(s) or standoff(s) 631 that is configured to provide a gap 632, depression 632, or well 632 or another structure that allows wafer 100 and film 310 to expand without contacting support structure 63 during subsequent processing. In one embodiment, frame 40 can be reversibly attached to support structure 63 using vacuum or a clamping structure.

In one embodiment, layer 281 is separated by a mechanical device 61, such as a stylus 610 or a rotating wheel 620 as illustrated in FIG. 12. In one embodiment, layer 281 is free floating as illustrated in FIG. 12. In another embodiment, surface 281 can be in contact with a flexible support structure such as polyimide or any number of flexible polymers. In one embodiment, mechanical device 61 is configured to provide a reduced area or localized pressure point 623 onto wafer 10. In one embodiment, mechanical device 61 can be configured to have a radius that is approximately half the width of die 12, 14, 16, and 19. In another embodiment, mechanical device 61 can be configured to have a radius that is approximately equal to a width of die 12, 14, 16, and 19. In one embodiment, the radius of mechanical device 61 can be selected to be approximately double the size of die 12, 14, 16, and 19. Mechanical device 61 can be configured with pressure, speed, and alignment control. Also, mechanical device 61 can be configured with a quick disconnect device 611 to allow for simplified removal of mechanical device 61 from a main apparatus, which improves process flexibility. Mechanical device 61 can be made of a metal, rubber, organic solid material (for example, a plastic), ceramic, composite material, or combinations thereof. In the embodiment illustrated, rotating wheel 620 can be passed along tape 301 with sufficient pressure applied to separate layer 281 while minimizing any detrimental effects to die 12, 14, 16, and 19. In one embodiment, more than one mechanical device 61 can be used to separate layer 281.

Figure 13:
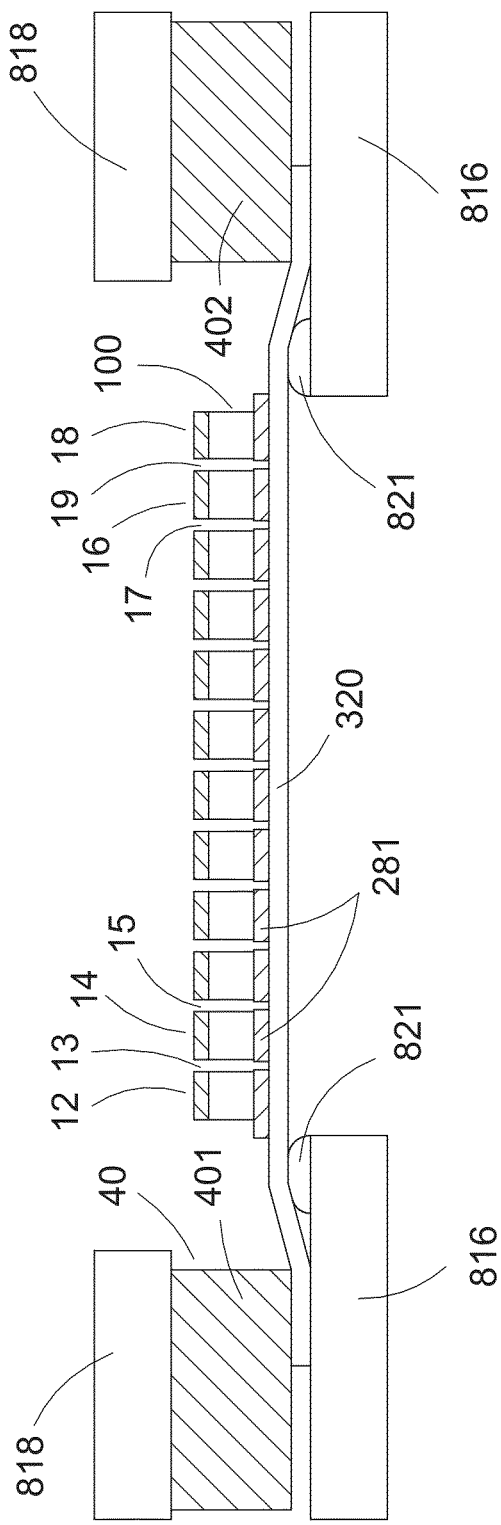
FIG. 13 illustrates a cross-sectional view of the second embodiment at a later stage of fabrication in accordance with the present invention.

FIG. 13 illustrates a cross-sectional view of wafer 100 at a subsequent fabrication step. In one embodiment, a carrier tape 320 is placed on the back surface or the surface adjacent layer 281 and carrier film 310 can be removed from the opposite side. In one embodiment, carrier tape 320 overlaps onto frame 40. In one embodiment, frame 40 with carrier tape 320 and wafer 100 can be placed within a mechanical device that helps spread-out or expand carrier tape 320 to better facilitate, for example, a pick and place step. In one embodiment, frame 40 can be placed between clamp portions 816 and 818 as generally illustrated in FIG. 13. In one embodiment, step or stand-off portions 821 can be placed or attached onto clamp portions 818 to provide a structure for expanding or stretching carrier tape 320. This expansion effect can increase the distance between adjacent die on wafer 100 to better facilitate the removal of the individual die from carrier tape 320. In one embodiment, carrier tape 320 can be exposed to UV light to reduce the adhesive characteristics of the tape to make removal of the die easier.

Figure 14:
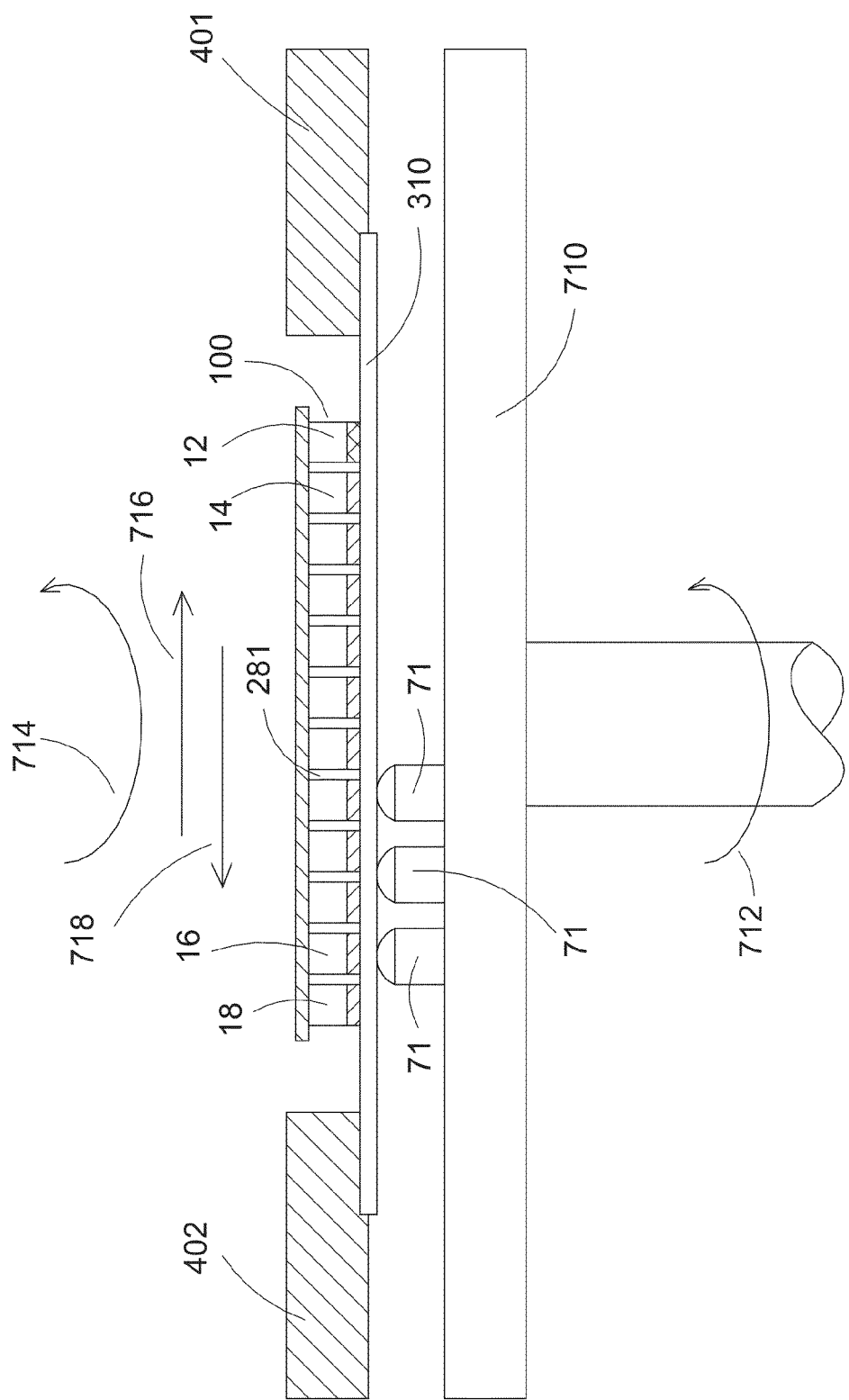
FIG. 14 illustrates a cross-sectional view of the second embodiment in accordance with an alternative manufacturing process.

FIG. 14 illustrates a cross-sectional and perspective view of wafer 100 at subsequent process step as an alternative embodiment to FIG. 12. In one embodiment, multiple mechanical devices 71 can be formed on a plate structure 710. Mechanical devices 71 can be similar to mechanical devices 61. In one embodiment, mechanical devices 71 can be styluses configured to provide localized pressure points onto wafer 100. In one embodiment, plate structure 710 can be placed against film 310 with sufficient pressure applied to separate layer 281. In one embodiment, plate structure 710 can rotate as illustrated by arrow 712. In another embodiment, frame 40 can be rotated over plate structure 710 as illustrated by arrow 714 or moved horizontally back-and-forth over plate structure 710 as illustrated by arrows 716 and 718 to separate layer 281. In a subsequent step, die 12, 14, 16, and 18 can be removed from the carrier tape as part of a further assembly process using, for example, the method described and generally illustrated in FIG. 13. In one embodiment, the carrier tape can be exposed to a UV light source prior to the pick-and-place step to reduce the adhesiveness of the tape. It is understood that prior to pick and place an additional carrier tape can be placed adjacent layer 281 and carrier film 310 can be removed.

Figure 15:
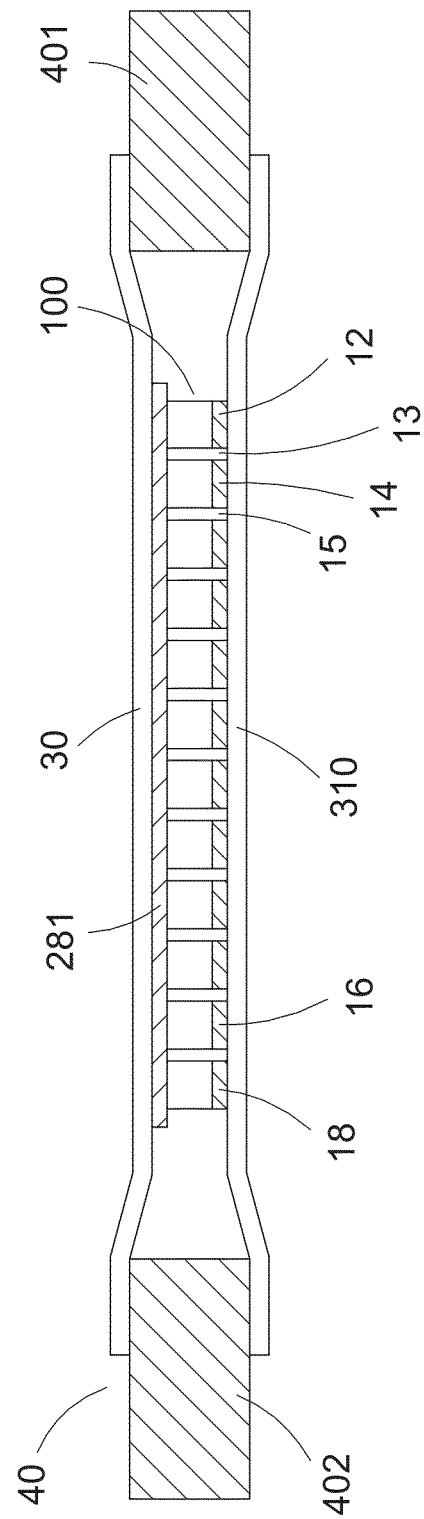
FIG. 15 illustrates the wafer of FIG. 10 in accordance with an additional embodiment of the present invention.

FIG. 15 illustrates a cross-sectional view of wafer 100 as an alternative embodiment after processing described in conjunction with FIG. 10. In one embodiment, carrier film 310 is placed overlying the front surface or the surface opposite to layer 281. In one embodiment, carrier film 310 overlaps onto carrier 40 as illustrated in FIG. 15. In the present embodiment, carrier tape 30 is left in place for additional processing. It should be noted that FIG. 15 represents an idealized image and that carrier film 310 and carrier tape 30 may come into contact with each other; optionally an additional release layer (not shown) may be added between carrier film 310 and carrier tape 30.

Figure 16:
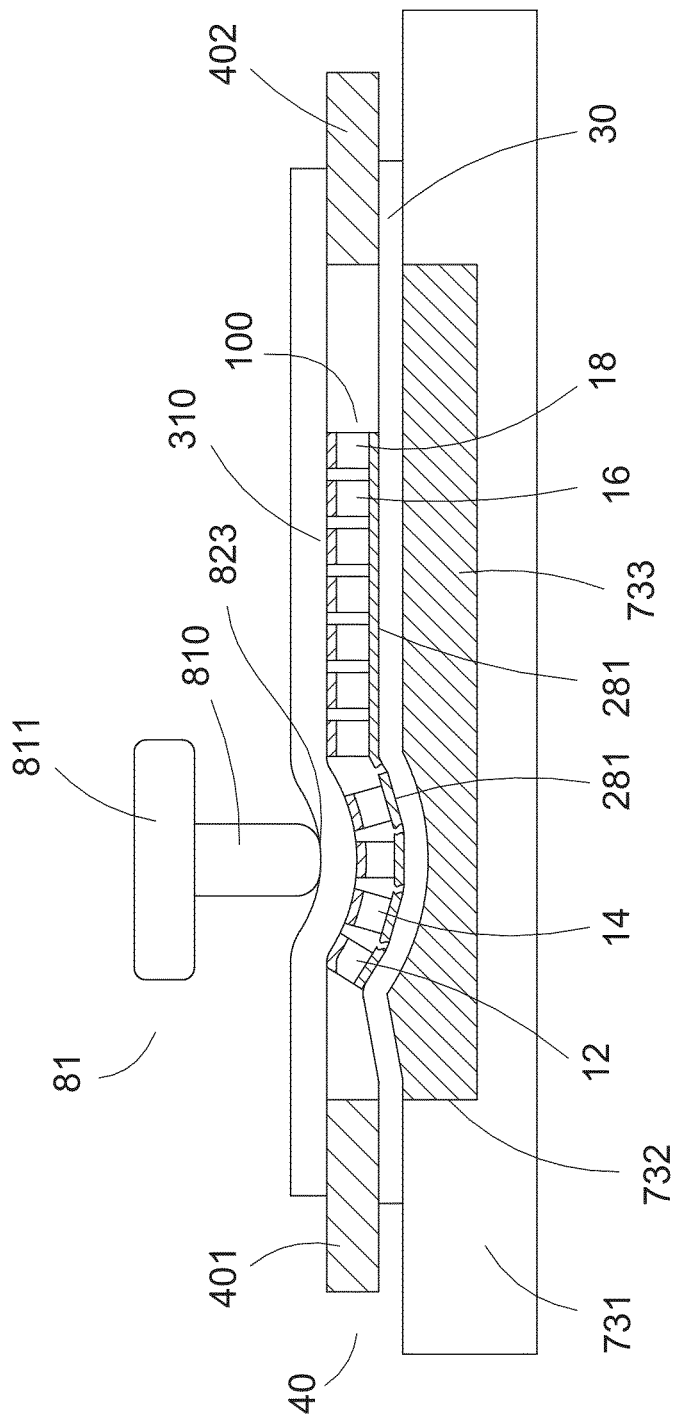
FIG. 16 illustrates a cross-sectional view of the additional embodiment after further processing in accordance with the present invention.

FIG. 16 illustrates a cross-sectional view of wafer 100 at a subsequent process step. In one embodiment, frame 40 can be placed onto a holding device 731 or support structure 731. In one embodiment, support structure 631 can be configured to include a gap 732, depression 732, or well 732 or another structure that allows wafer 100 and tape 30 to expand without contacting support structure 731 during subsequent processing. Support structure 631 may be heated or cooled to heat or cool layer 30. Support structure 631 may have adjustable vacuum or air pressure against layer 30. In one embodiment, frame 40 can be reversibly attached to support structure 731 using vacuum or a clamping structure. In an optional embodiment, a compressive layer 733 can be placed within well 732 to provide additional elastic, resistive, or reactive force during the singulation of layer 281. In one embodiment, compressive layer 733 can be a rubber pad or a pressurized membrane structure.

In one embodiment, layer 281 is separated by mechanical device 81, such as a stylus 810 as illustrated in FIG. 16, which is applied to the front side of wafer 100 through film 310. In accordance with the present embodiment, the singulation of layer 281 is carried with wafer 100 placed between tape 30 and film 310. Mechanical device 81 is configured to provide a mechanical force along the front side of wafer 100 sufficient to propagate separation lines or cracks within singulation lines 13, 15, 17, and 19. In one embodiment, mechanical device 81 is configured to provide a reduced area or localized pressure point 823 onto wafer 100. In one embodiment, stylus 810 can be configured to have a radius that is approximately half the width of die 12, 14, 16, and 18. In another embodiment, stylus 810 can be configured to have a radius that is approximately equal to a width of die 12, 14, 16, and 18. In one embodiment, the radius of stylus 810 can be selected to be approximately double the size or greater of die 12, 14, 16, and 18. Mechanical device 81 can be configured with pressure, speed, and alignment control. Also, mechanical device 81 can be configured with a quick disconnect device 811 to allow for simplified removal of mechanical device 81 from a main apparatus, which improves process flexibility. Mechanical device 81 can be made of a metal, rubber, organic solid material (for example, a plastic), ceramic, composite material, combinations thereof, or other materials as known to those of ordinary skill in the art. In one embodiment, more than one mechanical device 81 can be used to separate layer 281.

Figure 17:
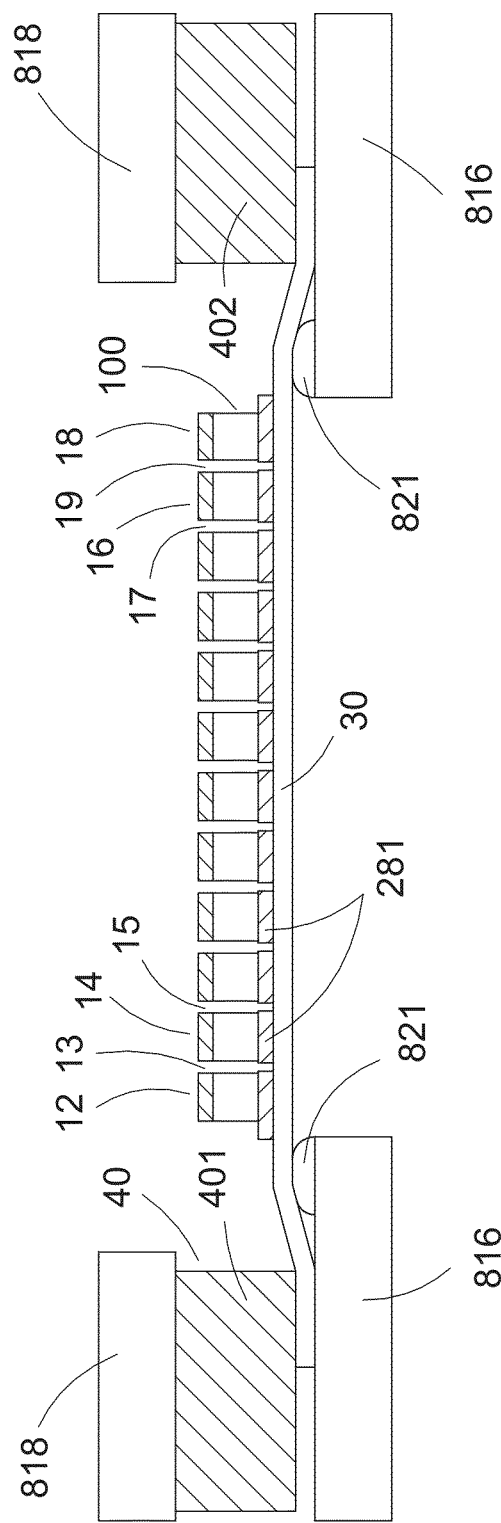
FIG. 17 illustrates a cross-sectional view of the additional embodiment at a later stage of fabrication in accordance with the present invention.

FIG. 17 illustrates a cross-sectional view of wafer 100 at a subsequent fabrication step. In one embodiment, carrier film 310 can be removed from the front side of wafer 100 leaving carrier tape 30 in place. In one embodiment, frame 40 with carrier tape 30 and wafer 100 can be placed into a mechanical device that helps spread-out or expand carrier tape 30 to better facilitate, for example a pick and place step. In one embodiment, frame 40 can be placed between clamp portions 816 and 818 as generally illustrated in FIG. 17. In one embodiment, step or stand-off portions 821 can be placed or attached onto clamp portions 818 to provide a structure for expanding or stretching carrier tape 320. This expansion effect can increase the distance between adjacent die on wafer 100 to better facilitate the removal of the individual die from carrier tape 30. In one embodiment, carrier tape 30 can be exposed to UV light to reduce the adhesive characteristics of the tape to make removal of the die easier.

Figure 18:
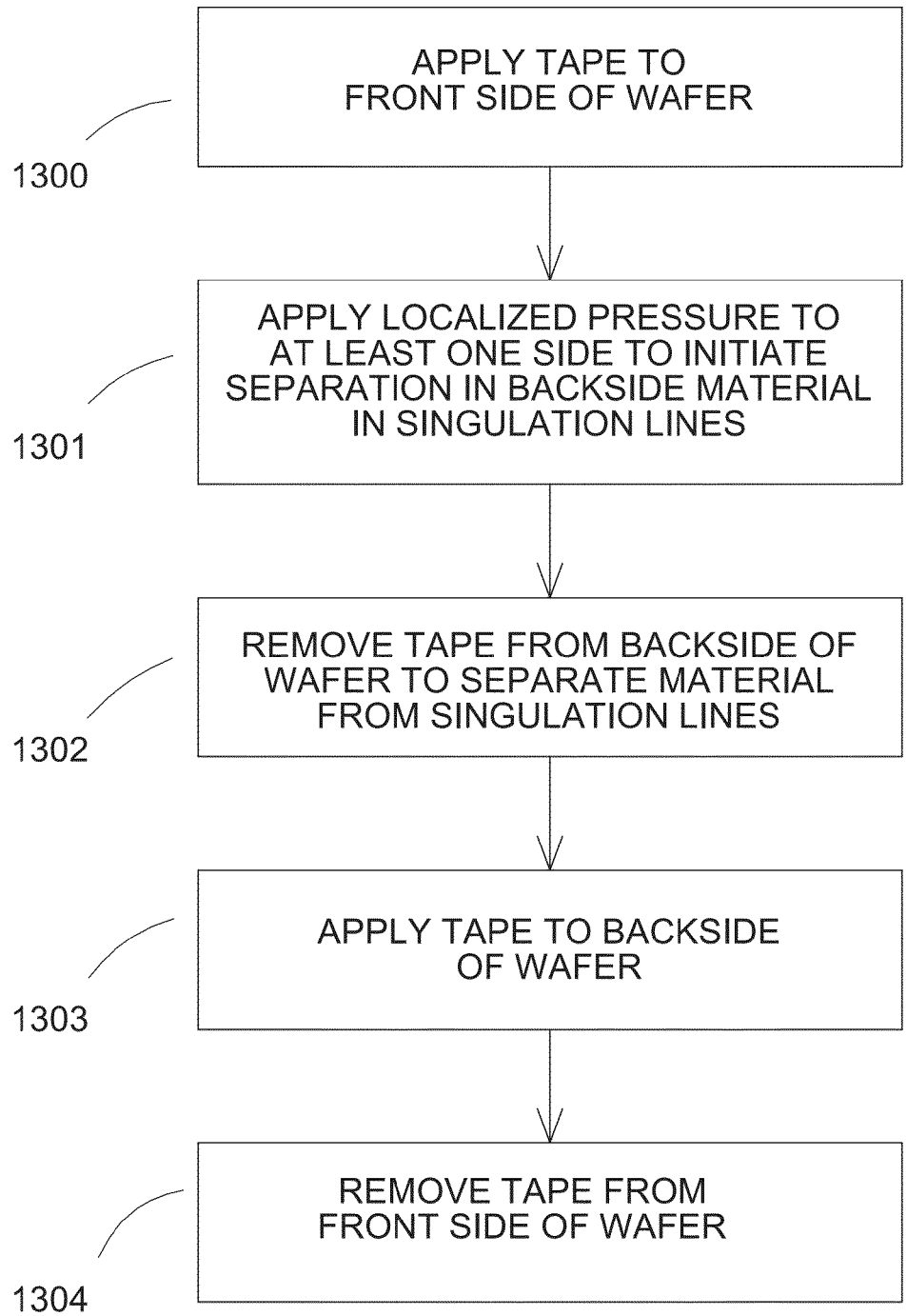
FIG. 18 illustrates a flowchart of a process for singulating back layer material in accordance with a further embodiment of the present invention.

FIG. 18 illustrates a flow chart for singulating thick backside material in accordance with another embodiment. FIG. 18 will be described using wafer 100 embodiment starting at FIG. 10 after wafer 100 has been singulated. It is understood that such singulation can be by any method where the singulation terminates proximate to backside layer 281. In step 1300 carrier film 310 is applied or attached to the front side of wafer 100 with carrier tape 30 adjacent to layer 281. In the present embodiment, carrier film 310 can be selected to have a higher adhesive strength between carrier film 310 and wafer 100 compared to the adhesive strength between carrier tape 30 and wafer 100. In one embodiment, the difference in adhesive strengths can be selected to better maintain the die in place while carrier tape 30 is subsequently removed after layer 281 is singulated or separated. Carrier tape 30 is selected to have an adhesive strength sufficient to remove material from the singulation lines without pulling the die away from carrier film 310 or damaging the remaining layer 281 material on the individual die.

In optional step 1301, a localized pressure is applied to at least one side of wafer 100 to initiate cracks, crack lines, or separation lines in layer 281 within the singulation lines. In one embodiment, stylus 611 can be used. In another embodiment, a pressurized liquid or gas can be used. In one embodiment, the localized pressure can be applied the front side of wafer 100. In another embodiment, the localized pressure can be applied to the backside of wafer 100. In a further embodiment, the localized pressure can be applied to both sides of wafer 100.

In step 1302, carrier tape 30 can be optionally exposed to a UV light source and then removed wafer 100. In one embodiment, the removal of carrier tape 30 during step 1302 removes material from singulation lines 13, 15, 17, and 19, which is facilitated by the differences in adhesive strengths between carrier film 310 and carrier tape 30. In one embodiment, the removal of the material can be facilitated without having to stretch the carrier tape or use the stylus to separate the back metal or back layer, although removal of the metal will require less adhesive force if separated by the stylus prior to the removal of carrier tape 30.

In step 1303, a new carrier tape can be applied to the backside of wafer 100, and then carrier film 310 can be removed from the front side of wafer 100 in step 1304. Wafer 100 can then be subjected to further processing.

It was found that the present embodiments produce improved results compared to methods using carrier tapes on one side of the wafer only. In accordance with the present embodiment, carrier tape layers are placed on both sides of the wafer during the singulation of the backside material. The present embodiment improves the quality of the singulated backside material and reduces yield loss due to singulation lines propagating into die active areas.

From all of the foregoing, one skilled in the art can determine that, according to one embodiment, a method of singulating a wafer (for example, elements 10, 100) comprises providing a wafer having a plurality of die (for example, elements 12, 14, 16, 18) formed on the wafer and separated from each other by spaces, wherein the wafer has first and second opposing major surfaces (for example, elements 21, 22), and wherein a layer of material (for example, elements 28, 281) is formed along the second major surface. The method includes placing the wafer onto a first carrier substrate (for example, element 30), wherein the layer of material is adjacent the first carrier substrate. The method includes singulating the wafer through the spaces to form singulation lines (for example, elements 13, 15, 17, 19), wherein singulating includes stopping in proximity to the layer of material. The method includes applying a localized pressure (for example, element 61, 71, 710, 81) to at least one of the first major surface or the second major surface to separate the layer of material in the singulation lines.

From all of the foregoing, one skilled in the art can determine that, according to another embodiment, a method of singulating die from a wafer (for example, elements 10, 100) comprises providing a wafer having a plurality of die (for example, elements 12, 14, 16, 18) formed on the wafer and separated from each other by spaces, wherein the wafer has first and second opposing major surfaces (for example, elements 21, 22) and wherein a layer of material (for example, elements 28, 281) is formed along the second major surface. The method includes placing the wafer onto a first carrier substrate (for example, element 30), wherein the layer of material is adjacent the first carrier substrate; singulating the wafer through the spaces to form singulation lines (for example, elements 13, 15, 17, 19), wherein the singulation lines terminate before penetrating completely through the layer of material. The method includes placing the wafer onto to a second carrier substrate (for example, element 310), wherein the layer of material is opposite to the second carrier substrate. The method includes moving a mechanical device along the second carrier substrate to separate the layer of material in the singulation lines.

In one embodiment of the foregoing method, placing the wafer onto the first carrier substrate can include placing the wafer onto a first carrier tape, and placing the wafer onto the second carrier substrate can include placing the wafer onto a second carrier tape. In another embodiment, moving the mechanical device can include moving at least one stylus. In an additional embodiment, providing the wafer can include providing a semiconductor wafer having a wafer backside coating layer overlying the second major surface. In a further embodiment, singulating the wafer can include plasma etching the wafer.

From all of the foregoing, one skilled in the art can determine that, according to an additional embodiment, a method of singulating a substrate (for example, elements 10, 100) comprises providing a substrate having a plurality of die (for example, elements 12, 14, 16, 18) formed on the substrate and separated from each other by spaces, wherein the substrate has first and second opposing major surfaces (for example, elements 21, 22), and wherein a layer of material (for example, elements 28, 281) is formed overlying the second major surface. The method includes placing a carrier tape (for example, element 30) onto the layer of material. The method includes plasma etching the substrate through the spaces to form singulation lines (for example, elements 13, 15, 17, 19), wherein the singulation lines terminate in proximity to the layer of material. The method includes placing a carrier film (for example, element 310) onto the substrate opposite to the layer of material. The method includes applying a localized pressure to the first major surface using a mechanical device to separate the layer of material.

In one embodiment of the foregoing method, applying a localized pressure can include applying a localized pressure with at least one stylus. In another embodiment providing the substrate includes providing a semiconductor wafer having a wafer backside coating layer formed overlying the second major surface.

From all of the foregoing, one skilled in the art can determine that, according to further embodiment, a method of forming an electronic device comprises providing a wafer (for example, elements 10, 100) having a plurality of die (for example, elements 12, 14, 16, 18) formed on the wafer and separated from each other by spaces, wherein the wafer has first and second opposing major surfaces (for example, elements 21, 22), and wherein a layer of material (for example, elements 28, 281) is formed along the second major surface, and wherein the layer of material is placed on a first carrier substrate. The method includes singulating the wafer through the spaces to form singulation lines (for example, elements 13, 15, 17, 19). The method includes placing the wafer onto a second carrier substrate (for example, element 310), wherein the layer of material is opposite to the second carrier substrate. The method includes moving a mechanical device along one of the first or second carrier substrates to separate the layer of material in the singulation lines.

In one embodiment of the foregoing method, placing the wafer onto the first carrier substrate can include placing the wafer onto a first carrier tape, and placing the wafer onto the second carrier substrate can include placing the wafer onto a second carrier tape. In another embodiment, moving the mechanical device can include moving the mechanical device with both the first carrier substrate and the second carrier substrate attached to the wafer. In an additional embodiment, moving the mechanical device can include moving at least one carrier substrate. In a further embodiment, moving the mechanical device can include moving at least one stylus along the second carrier substrate. In a still further embodiment, moving the mechanical device can include moving the mechanical device while the first carrier tape is placed against a compressive layer. In another embodiment, placing the wafer onto the second carrier substrate can include placing the wafer onto the second carrier substrate, wherein the second carrier substrate has a higher adhesive strength than the first carrier substrate. In an additional embodiment, one or more of the foregoing methods can further include removing the first carrier substrate after moving the mechanical device, wherein removing the first carrier substrate removes portions of the layer of material in the singulation lines. In one embodiment, removing the first carrier substrate can include removing the first carrier substrate without stretching either the first or the second carrier tapes before the first carrier tape is removed.

From all of the foregoing, one skilled in the art can determine that, according to a still further embodiment, an apparatus for separating die (for example, elements 12, 14, 16, 18) from a wafer (for example, elements 10, 100) comprises a structure for holding the wafer on a carrier substrate, wherein the semiconductor wafer has a plurality of singulation lines that terminate proximate to a layer of material on the wafer; and a structure for applying a localized pressure (for example, elements 61, 71, 81) to the wafer through the carrier substrate.

In one embodiment of the foregoing apparatus the semiconductor wafer has a plurality of singulation lines etched through the semiconductor wafer. In another embodiment, the singulation lines are plasma etched through the semiconductor wafer. In an additional embodiment, the structure for applying the localized pressure can be configured to move in relation to the wafer. In a further embodiment, the structure for applying the localized pressure can be configured to rotate. In a still further embodiment, the structure for applying the localized pressure comprises more than one stylus. In one embodiment, the structure for holding can include a compressive layer (for example, element 733). In another embodiment, the compressive layer comprises a pressurized membrane structure.

From all of the foregoing, one skilled in the art can determine that, according to another embodiment, a method of singulating a substrate comprises providing a substrate (for example, elements 10, 100) having a plurality of die (for example, elements 12, 14, 16, 18) formed on the substrate and separated from each other by spaces, wherein the substrate has first and second opposing major surfaces (for example, elements 21, 22), and wherein a layer of material (for example, elements 28, 281) is formed overlying the second major surface. The method includes placing a carrier tape (for example, element 30) onto the layer of material. The method includes plasma etching the substrate through the spaces to form singulation lines (for example, elements 13, 15, 17, 19), wherein the singulation lines terminate in proximity to the layer of material. The method includes applying a localized pressure to the second major surface using a mechanical device (for example, elements 61, 71, 81) to separate the layer of material.

From all of the foregoing, one skilled in the art can determine that, according to an additional embodiment, a method of singulating a substrate comprises providing a substrate (for example, elements 10, 100) having a plurality of die (for example, elements 12, 14, 16, 18) formed on the substrate and separated from each other by spaces, wherein the substrate has first and second opposing major surfaces (for example, elements 21, 22), and wherein a layer of material (for example, elements 28, 281) is formed overlying the second major surface. The method includes placing a first carrier tape (for example, element 30) onto the layer of material. The method includes plasma etching the substrate through the spaces to form singulation lines (for example, elements 13, 15, 17, 19), wherein the singulation lines terminate in proximity to the layer of material. The method includes placing a second carrier tape (for example, element 310) onto the substrate opposite to the layer of material; and removing the first carrier tape to separate the layer of material in singulation lines.

From all of the foregoing, one skilled in the art can determine that, according to further embodiment, a method of singulating a substrate comprises providing a substrate (for example, elements 10, 100) having a plurality of die (for example, elements 12, 14, 16, 18) formed on the substrate and separated from each other by spaces, wherein the substrate has first and second opposing major surfaces (for example, elements 21, 22), and wherein a layer of material (for example, elements 28, 281) is formed overlying the second major surface. The method includes placing a first carrier tape (for example, element 30) onto the layer of material. The method includes plasma etching the substrate through the spaces to form singulation lines (for example, elements 13, 15, 17, 19), wherein the singulation lines terminate in proximity to the layer of material. The method includes placing a second carrier tape (for example, element 310) onto the substrate opposite to the layer of material. The method includes applying a localized pressure to one major surface of the substrate using a mechanical device (for example, 61, 71, 81) to separate the layer of material in the singulation lines while substrate is attached to both the first and second carrier tapes.

From all of the foregoing, one skilled in the art can determine that, according to a still further embodiment, a method of singulating a substrate comprises providing a substrate (for example, elements 10, 100) having a plurality of die (for example, elements 12, 14, 16, 18) formed on the substrate and separated from each other by spaces, wherein the substrate has first and second opposing major surfaces (for example, elements 21, 22), and wherein a layer of material (for example, elements 28, 281) is formed overlying the second major surface. The method includes placing a first carrier tape (for example, element 30) onto the layer of material. The method includes plasma etching the substrate through the spaces to form singulation lines, wherein the singulation lines terminate in proximity to the layer of material. The method includes placing a second carrier tape (for example, element 310) onto the substrate opposite to the layer of material. The method includes removing the first carrier tape to separate the layer of material in singulation lines.

In view of all of the above, it is evident that a novel method and apparatus are disclosed. Included, among other features, is placing a substrate having a layer of material on a major surface of the substrate onto a carrier tape, and forming singulation lines through the substrate to expose portions of the layer of material within the singulation lines. A second carrier tape is applied to the front side of the substrate, and a mechanical device that provides a localized pressure to the front side of the substrate is used to separate the layer of material from the back side of the substrate while the substrate has carrier tape layers on both sides. The method provides, among other things, an efficient, reliable, and cost effective process for singulating substrates that include back layers, such as thicker back metal layers or WBC layers.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those

What is claimed is:

1. A method of singulating a wafer comprising:
providing a wafer having a plurality of die formed on the wafer and separated from each other by spaces, wherein the wafer has first and second opposing major surfaces, and wherein a layer of material is formed along the second major surface;
placing the wafer onto a first carrier substrate, wherein the layer of material is adjacent the first carrier substrate;
singulating the wafer through the spaces to form singulation lines, wherein singulating includes stopping in proximity to the layer of material; and
applying a localized pressure to at least one of the first major surface or the second major surface to separate the layer of material in the singulation lines.

2. The method of claim 1, wherein providing the wafer includes providing the wafer where the layer of material has gaps between at least some adjacent die, and wherein the gaps are substantially aligned with corresponding spaces.

3. The method of claim 1, wherein providing the wafer includes providing the wafer where the layer of material is separated from at least some die edges.

4. The method of claim 1, wherein applying the localized pressure comprises moving a mechanical device along the first carrier substrate.

5. The method of claim 1 further comprising the step of placing a second carrier substrate on the first major surface, and wherein applying the localized pressure includes moving a mechanical device along the second carrier substrate.

6. The method of claim 1, wherein placing the wafer onto the first carrier substrate comprises placing the wafer onto a first carrier tape.

7. The method of claim 1, wherein applying the localized pressure includes applying the localized pressure with the carrier substrate stationary.

8. The method of claim 7, wherein applying the localized pressure with the at least one stylus comprises applying the localized pressure with at least one stylus having a radius that is approximately double the cross-sectional area of a die within the wafer.

9. The method of claim 1, wherein applying the localized pressure includes applying the localized pressure with the carrier substrate moving.

10. The method of claim 1, wherein applying the localized pressure comprises applying the localized pressure with at least one stylus.

11. The method of claim 1, wherein providing the wafer comprises providing a semiconductor wafer having a back metal layer overlying the second major surface.

12. The method of claim 1, wherein singulating the wafer comprises plasma etching the wafer.

13. A method of singulating die from a wafer comprising:
providing a wafer having a plurality of die formed on the wafer and separated from each other by spaces, wherein the wafer has first and second opposing major surfaces, and wherein a layer of material is formed along the second major surface;
placing the wafer onto a first carrier substrate, wherein the layer of material is adjacent the first carrier substrate;
singulating the wafer through the spaces to form singulation lines, wherein the singulation lines terminate before penetrating completely through the layer of material;
placing the wafer onto a second carrier substrate, wherein the layer of material is opposite to the second carrier substrate; and
moving a mechanical device along the second carrier substrate to separate the layer of material in the singulation lines.

14. The method of claim 13, wherein placing the wafer onto the first carrier substrate comprises placing the wafer onto a first carrier tape, and wherein placing the wafer onto the second carrier substrate comprising placing the wafer onto a second carrier tape.

15. The method of claim 13, wherein moving the mechanical device comprises moving at least one stylus.

16. The method of claim 13, wherein providing the wafer comprises providing a semiconductor wafer having a wafer backside coating layer overlying the second major surface.

17. The method of claim 13, wherein singulating the wafer comprises plasma etching the wafer.

18. A method of singulating a substrate comprising:
providing a substrate having a plurality of die formed on the substrate and separated from each other by spaces, wherein the substrate has first and second opposing major surfaces, and wherein a layer of material is formed overlying the second major surface;
placing a carrier tape onto the layer of material;
plasma etching the substrate through the spaces to form singulation lines, wherein the singulation lines terminate in proximity to the layer of material;
placing a carrier film onto the substrate opposite to the layer of material; and
applying a localized pressure to the first major surface using a mechanical device to separate the layer of material.

19. The method of claim 18, wherein applying a localized pressure comprises applying a localized pressure with at least one stylus.

20. The method of claim 18, wherein providing the substrate includes providing a semiconductor wafer having a wafer backside coating layer formed overlying the second major surface.

21. A method of forming an electronic device comprising:
providing a wafer having a plurality of die formed on the wafer and separated from each other by spaces, wherein the wafer has first and second opposing major surfaces, and wherein a layer of material is formed along the second major surface, and wherein the layer of material is placed on a first carrier substrate;
singulating the wafer through the spaces to form singulation lines;
placing the wafer onto a second carrier substrate, wherein the layer of material is opposite to the second carrier substrate;
moving a mechanical device along one of the first or second carrier substrates to separate the layer of material in the singulation lines.

22. The method of claim 21, wherein placing the wafer onto the first carrier substrate comprises placing the wafer onto a first carrier tape, and wherein placing the wafer onto the second carrier substrate comprising placing the wafer onto a second carrier tape.

23. The method of claim 21, wherein moving the mechanical device includes moving the mechanical device with both the first carrier substrate and the second carrier substrate attached to the wafer.

24. The method of claim 21, wherein moving the mechanical device includes moving at least one carrier substrate.

25. The method of claim 21, wherein moving the mechanical device comprises moving at least one stylus along the second carrier substrate.

26. The method of claim 21, wherein moving the mechanical device comprises moving the mechanical device while the first carrier tape is placed against a compressive layer.

27. The method of claim 26, wherein placing the wafer onto the second carrier substrate comprises placing the wafer onto the second carrier substrate, wherein the second carrier substrate has a higher adhesive strength than the first carrier substrate.

28. The method of claim 27 further comprising removing the first carrier substrate after moving the mechanical device, wherein removing the first carrier substrate removes portions of the layer of material in the singulation lines.

29. The method of claim 28, wherein removing the first carrier substrate comprises removing the first carrier substrate without stretching either the first or the second carrier tapes before the first carrier tape is removed.

30. A method of singulating a wafer comprising:
providing a wafer having first and second opposing major surfaces, a plurality of die formed adjacent the first major surface, a layer of conductive material along the second major surface, the plurality of die separated by singulation lines that terminate in proximity to the layer of material, and a first carrier substrate adjacent the layer of material; and
applying a localized pressure to at least one of the first major surface or the second major surface to separate the layer of conductive material in the singulation lines.

31. The method of claim 30 further comprising placing a second carrier substrate on the first major surface, and wherein applying the localized pressure includes moving a mechanical device along the second carrier substrate.

* * * * *